United States Patent
Yasuda et al.

[11] Patent Number: 6,163,111
[45] Date of Patent: Dec. 19, 2000

[54] MERCURY LAMP OF THE SHORT ARC TYPE

[75] Inventors: Yukio Yasuda; Masanori Sugihara, both of Himeji, Japan

[73] Assignee: Ushiodenki Kabushiki Kaisha, Tokyo, Japan

[21] Appl. No.: 09/217,191

[22] Filed: Dec. 22, 1998

[30] Foreign Application Priority Data

Dec. 25, 1997 [JP] Japan ................................. 9-366203

[51] Int. Cl.⁷ .................................................... H01J 61/12
[52] U.S. Cl. ........................... 313/637; 313/573; 313/634
[58] Field of Search .................................... 313/573, 634, 313/637

[56] References Cited

U.S. PATENT DOCUMENTS 4,728,857  3/1988  English et al. .
5,834,895  11/1998 Dolan et al. .

FOREIGN PATENT DOCUMENTS 0 562 872  9/1993  European Pat. Off. .
0 866 492  9/1998  European Pat. Off. .

*Primary Examiner*—Vip Patel
*Attorney, Agent, or Firm*—Nixon Peabody LLP; David S. Safran

[57] ABSTRACT

To devise a mercury lamp of the short arc type with high power in which an arc tube can be kept unfouled over a long time and the demand for an increase in the amount of radiation can be met, in a quartz arc tube, a cathode and an anode are disposed opposite one another and the arc tube is filled with mercury and a rare gas. At least argon (Ar) and/or krypton (Kr) in an amount from 1.0 to 8 atm at room temperature is added as the rare gas. The amount depends on the value of $((Wd)^{1/2}/R)$ where R is half the maximum diameter of the bulb in cm, d is the thickness of the bulb in cm, and W the input power supplied to the lamp in kW.

18 Claims, 3 Drawing Sheets

| lamp no. | pressure Xe(atm) | pressure Ar,Kr(atm) | voltage (V) | current (A) | relative irradiance of the i-line |
|---|---|---|---|---|---|
| A | Xe(2.0) | 0 | 26.9 | 78.1 | 1.00 |
| B1 | Xe(2.0) | Ar(0.3) | 25.1 | 83.7 | 1.02 |
| C1 | Xe(2.0) | Ar(1.0) | 25.6 | 82.0 | 1.06 |
| D1 | Xe(2.0) | Ar(3.0) | 26.6 | 78.9 | 1.12 |
| E1 | Xe(2.0) | Ar(8.0) | 27.4 | 76.6 | 1.18 |
| F1 | Xe(2.0) | Ar(12.0) | 28.5 | 73.7 | 1.20 |
| B2 | Xe(2.0) | Kr(0.3) | 25.4 | 82.7 | 1.01 |
| C2 | Xe(2.0) | Kr(1.0) | 25.9 | 81.1 | 1.04 |
| D2 | Xe(2.0) | Kr(3.0) | 27.0 | 77.8 | 1.08 |
| E2 | Xe(2.0) | Kr(8.0) | 27.9 | 75.3 | 1.13 |
| F2 | Xe(2.0) | Kr(12.0) | 29.0 | 72.4 | 1.15 |

FIG. 3

| lamp no. | pressure Xe(atm) | pressure Ar(atm) | pressure Kr(atm) | pressure Ar+Kr | relative irradiance of the i-line |
|---|---|---|---|---|---|
| A | 2.0 | 0.0 | 0.0 | 0.0 | 1.00 |
| G | 0.0 | 0.3 | 0.3 | 0.6 | 1.03 |
| H | 0.0 | 0.5 | 0.5 | 1.0 | 1.05 |
| J | 0.0 | 1.5 | 1.5 | 3.0 | 1.10 |
| K | 0.0 | 4.0 | 4.0 | 8.0 | 1.15 |
| L | 0.0 | 5.0 | 5.0 | 1 0 | 1.17 |
| M | 0.3 | 0.5 | 0.5 | 1.0 | 1.05 |
| N | 3.0 | 0.5 | 0.5 | 1.0 | 1.04 |

FIG. 4

| lamp no. | R(cm) | thickness of the bulb d(cm) | power W(Kw) | (Wd)^(1/2)/R | allowability |
|---|---|---|---|---|---|
| X1 | 2.0 | 0.40 | 2.0 | 0.447 | X devitrification of the bulb |
| X2 | 2.0 | 0.40 | 1.5 | 0.387 | ○ |
| X3 | 3.0 | 0.30 | 2.0 | 0.258 | ○ |
| X4 | 3.0 | 0.20 | 2.0 | 0.211 | ○ |
| X5 | 4.0 | 0.30 | 2.0 | 0.194 | X absence of the vaporization of the mercury |

FIG. 5

| lamp no. | R(cm) | thickness of the bulb d(cm) | power W(Kw) | (Wd)^(1/2)/R | allowability |
|---|---|---|---|---|---|
| Y1 | 2.0 | 0.40 | 2.0 | 0.447 | X devitrification of the bulb |
| Y2 | 2.0 | 0.35 | 4.5 | 0.418 | ○ |
| Y3 | 3.0 | 0.30 | 2.0 | 0.258 | ○ |
| Y4 | 3.0 | 0.45 | 1.5 | 0.205 | ○ |
| Y5 | 4.0 | 0.30 | 2.0 | 0.194 | X absence of the vaporization of the mercury |

FIG. 6

| lamp no. | R(cm) | thickness of the bulb d(cm) | power W(Kw) | (Wd)^(1/2)/R | allowability |
|---|---|---|---|---|---|
| Z1 | 3.0 | 0.35 | 4.5 | 0.418 | X devitrification of the bulb |
| Z2 | 2.0 | 0.40 | 1.5 | 0.387 | ○ |
| Z3 | 3.0 | 0.30 | 2.0 | 0.258 | ○ |
| Z4 | 4.0 | 0.35 | 2.0 | 0.209 | ○ |
| Z5 | 4.0 | 0.30 | 2.0 | 0.194 | X absence of the vaporization of the mercury |

FIG. 7

MERCURY LAMP OF THE SHORT ARC TYPE

BACKGROUND OF THE INVENTION

1. Field of the Invention

The invention relates to a mercury lamp of the short arc type. The invention relates especially to a mercury lamp of the short arc type which is used for a semiconductor exposure device.

2. Description of the Related Art

In the exposure process in the manufacture of semiconductors, recently a mercury lamp of the short arc type has been used which emits UV radiation with a main wavelength of 365 nm (hereinafter called the "i-line"). Since the degree of integration of an integrated solid-state circuit increases each year, accordingly, there is a greater and greater demand for image resolution during exposure. Furthermore, due to the increase in the exposure surface as a result of increasing the wafer aperture or due to the modified illumination which is used to achieve high image resolution, there is a demand for an increase in the amount of UW radiation from the light source (which is hereinafter called only the "amount of radiation").

Furthermore, there is also a demand for an increase in the throughput as an indicator of the amount of production per unit of time. Therefore, for the lamp as a light source there is a demand for high radiation efficiency, and for an emission device which comprises this light source, there is a demand for high focusing efficiency.

To obtain intensive i-line radiation, conventionally, a process was used in which the input power supplied to the lamp is increased. However, when the input power supplied to the lamp is increased, the thermal burden on the electrodes increases, causing more vigorous vaporization of the electrode material and acceleration of blackening of the arc tube. Furthermore, by increasing the input power, the arc tube necessarily has a larger outside dimension, by which a larger air blower device is needed to dissipate the heat produced by the lamp. A process in which the input power supplied to the lamp is increased to obtain intensive i-line radiation is therefore not desirable.

SUMMARY OF THE INVENTION

Therefore, a primary object of the present invention is to devise a mercury lamp of the short arc type in which an arc tube can be kept unfouled over a long time and intensive i-line radiation can be obtained.

A further object of the invention is to devise a UV emission device.

In a first aspect of the invention, in a mercury lamp of the short arc type in which a cathode and an anode are disposed opposite one another within a quartz arc tube filled with mercury and a rare gas, these objects are achieved by at least argon (Ar) with a pressure from 1.0 to 8 atm at room temperature being added as the rare gas, and by satisfying of the condition $0.211 \leq ((Wd)^{1/2}/R) \leq 0.387$, where R is half the maximum diameter of the arc tube in the radial direction in cm, d is the thickness of the bulb in cm and W is the input power supplied to the lamp in kW, the radial direction being defined as the direction of the cross section which is perpendicular to the longitudinal axis ofthe arc tube, i.e. the direction between the anode and the cathode.

In another aspect of the invention, in a mercury lamp of the short arc type which corresponds to the lamp described in the preceding paragraph, the object is achieved by krypton (Kr) with a pressure from 1.0 to 8 atm at room temperature being added as the rare gas instead of argon, and by the condition $0.205 \leq ((Wd)^{1/2}/R) \leq 0.418$ being satisfied.

In accordance with yet another aspect of the invention, in a mercury lamp of the short arc type which corresponds to the lamp described above, the object is achieved by at least krypton (Kr) and argon (Ar) with a total pressure from 1.0 to 8 atm at room temperature being added as the rare gas instead of argon, and by condition $0.209 \leq ((Wd)^{1/2}/R) \leq 0.387$ being satisfied.

The object is further-more achieved by a UV emission device which comprises a mercury lamp of the short arc type described above, and a power source which supplies a predetermined power to the mercury lamp.

Advantageously, in a UV emission device, the object is furthermore achieved by the mercury lamp of the short arc type being arranged vertically such that the anode is at the top and the cathode is at the bottom.

The mercury lamp of the short arc type in accordance with the present invention is characterized in that at least argon (Ar) or krypton (Kr) or a mixture of these gases under pressure is added as the buffer gas. It was possible to confirm by tests that the above described measure prevents broadening of the spectral width of the i-line. It was possible to ascertain that, therefore, the irradiance of the exposure surface increases. The reason for this is that the radiation efficiency increases by 10 to 20% as compared to adding xenon gas (Xe) at roughly 1 atm (this increased amount of efficiency corresponds to an increase from 20 to 40% when it is converted to power).

Furthermore, the invention is characterized by that fact that under the condition that at least argon (Ar) or krypton (Kr) or a mixture of these gases under pressure is added as the buffer gas with a predetermined pressure, numerical values are fixed with consideration of the thickness of the arc tube (hereinafter also called the "bulb") and the like. This is because the added buffer gas exerts strong effects on the thermal behavior and the arc characteristic within the arc tube when the molar ratio of the added buffer gas to the simultaneously added mercury is large.

In this respect, the inventors have confirmed that a mercury lamp in which Ar gas is added as the buffer gas reacts to air cooling of the arc tube in a more sensitive manner than a mercury lamp in which Xe gas is added. Specifically the following tests were performed:

Two lamps with completely identical forms were produced and mercury in the same amount (5 mg/cm$^3$) was added to them. In one lamp, 2 atm of Xe gas and in the other lamp 2 atm of Ar gas were added. These two lamps were operated alternatingly with the same heating apparatus which can change the intensity of compressed air cooling (air blowout speed) as desired.

Therefore, the relation between the air blowout speed and the unvaporized mercury was studied. In a mercury lamp in which Xe is added, at an air blowout speed of roughly 10 m/sec there was the beginning of condensation of the lamp mercury, and in the mercury lamp in which Ar was added, at an air blowout speed of roughly 6 m/sec there was the beginning of condensation of the mercury.

The fact that, in a mercury lamp filled with Ar, the mercury is beginning to condense at an air blowout speed lower than in a mercury lamp filled with Xe indicates that the lamp is easily influenced by cooling conditions, such as air blowout and the like. In this case, in a mercury lamp filled with Xe, there was no fluctuation of the arc, while in the mercury lamp filled with Ar there was fluctuation of the arc.

The reason for the above described beginning of condensation of mercury and the above described fluctuation of the radiant light due to the influences of cooling conditions is not entirely clear, but presumably lies in the following:

It can be imagined that the reason for this lies in the different thermal conductivities of the Ar gas and the Xe gas. If this thermal conductivity is high, the rate of transfer of the thermal energy increases. The temperature in the arc center is easily transferred into the vicinity of the inner bulb surfaces, while conversely the temperature in the vicinity of the inner surface of the bulb is easily transferred to the arc center. In this case, the thermal conductivities of the Ar gas, the Kr gas and the Xe gas K ($10^{-4}$ W/cm/K) are in the sequence (Ar: 1.63)>(Kr: 0.88)>(Xe: 0.50). The mercury lamp in which Ar gas or Kr gas is added are more easily influenced by air blowout cooling of the outside surface of the bulb and similar conditions than the mercury lamp filled with Xe gas. This leads to a temperature drop in the vicinity of the inner surface of the bulb and to a temperature drop in the arc center.

In the following, heat transfer is described with respect to the temperature inside and outside of the bulb using a simple model. The inventors present this model as follows:

First, the temperature of the outer surface of the bulb is considered. As the lamp, a symmetrical, round bulb with an outside radius of Ro and an inside radius of Ri is used. The thickness d of the bulb is computed according to the following equation (1):

$$d = Ro - Ri. \tag{1}$$

The input power supplied to the lamp is labeled W. The arc discharge takes place essentially in the center of the round bulb and its size is relatively small as compared to the inside radius of the bulb.

The supplied energy which is consumed in the arc is partially converted into light energy, while the remainder is converted into internal energy of the added gas and heating energy for the electrodes. Some of the light energy passes through the bulb and is emitted to the outside, while the remainder is absorbed by the bulb and thus becomes a heating source of the bulb. The added gas is carried by convection within the lamp, approaches the bulb, collides with the bulb and releases energy. Thus, it also becomes a heating source of the bulb.

Therefore, the energy supplied to the lamp passes partially through the bulb as light energy and is emitted to the outside, while the other part is emitted as thermal energy by the heated bulb and the remainder is emitted as thermal energy by convective heat transfer by the heated bulb. In doing so, if the ratio of the light energy which passes through the bulb and which is emitted to the outside relative to the supplied energy is labeled a, the equation of energy conservation with reference to the supplied energy W (the energy supplied to the lamp), viewed macroscopically, is computed using the following equation:

$$W = \alpha W + S\epsilon\sigma To^4 + Sh(To - Te) \tag{2}$$

This means that the supplied energy (W) which is consumed in the arc consists of light energy ($\alpha W$) which passes through the bulb and which is emitted to the outside, the thermal energy ($S\epsilon\sigma To^4$) which is emitted by the heated bulb, and the thermal energy ($Sh(To-Te)$) which is emitted by the heated bulb by convective heat transfer.

Furthermore, the above described equation (2) can be converted as follows:

$$(1-\alpha)W/S = \epsilon\sigma To^4 + h(To - Te) \tag{2}$$

Here:

S: outside area of the bulb sphere and is equal to $4\pi Ro^2$ $\epsilon$: emissivity of the quartz bulb and in the IR range is roughly 1.

$\sigma$: Stefan-Boltzmann constant and is $5.67 \times 10.219$ W/cm$^2$/K$^4$.

h: heat transfer factor and is 0.003 to 0.015 W/cm$^2$/K.

To: temperature of the outside surface of the bulb.

Te: equilibrium temperature (roughly 300 K) of the cooling air at a position which is relatively distant from the lamp.

$\alpha$: Ratio of the light energy which passes through the bulb and which is emitted to the outside, to the supplied energy.

It is generally known that, in Xe gas, the radiation efficiency of uninterrupted radiation is greater than in Ar gas or Kr gas. The a value of the Ar gas or the Kr gas is therefore less than that of the Xe gas. This means that, in a mercury lamp in which Ar gas or Kr gas is added, the proportion of energy which is used to heat the bulb is higher than in a mercury lamp in which Xe gas is added if the same energy W is supplied to the lamp.

Next, the temperature of the inner surface of the bulb is considered. If this temperature of the inner surface of the bulb is too high, devitrification of the bulb occurs. If it is too low, the mercury does not vaporize.

The temperature of the inside surface of the bulb is designated Ti. The energy which the bulb receives and which is converted into heat is designated $S\epsilon\sigma To^4 + Sh(To-Te)$. If this is designated Pin, the energy incident in the bulb is designated as follows:

$$Pin = (1-\alpha)W \tag{3}$$

If the thermal conductivity of the quartz bulb is labeled $\lambda$, based on the equation of heat conduction, the following formula is obtained which fixes the temperature of the inside and the outside of the bulb because a round bulb is assumed:

$$Ti - To = (Pin/4\pi\lambda)(1/Ri - 1/Ro) \tag{4}$$

Here, Ti is the temperature of the inside surface of the bulb, To is the temperature of the outside surface of the bulb, Ri is the inside radius of the bulb and Ro is the outside radius of the bulb. The typical value of the thermal conductivity $\lambda$ is 1 to 2 (W/m/K). The thickness d of the bulb is relatively less than the outside radius Ro of the bulb. Therefore, d<,<Ro is obtained. The second term (1/Ri-1/Ro) of the right-hand side of equation (4) is therefore designated ((Ro-Ri)/(Ri.Ro). Since the thickness d of the bulb is relatively less than the outside radius Ro of the bulb, Ri=Ro. If this is designated R, ($d/R^2$) is obtained. Furthermore, the temperature difference Ti-To is labelled $\delta T$. Equation (4) is therefore represented as follows:

$$\delta T = (Pin/4\pi\lambda)d/R^2 \tag{5}$$

or $$\delta T = ((Wd)^{1/2}/R)^2(1-\alpha)/(4\pi\lambda) \tag{6}$$

Based on equation (6), the temperature Ti of the inside of the bulb is computed using the following equation:

$$Ti = To + ((Wd)^{1/2}/R)^2(1-\alpha)/(4\pi\lambda) \tag{7}$$

This equation shows that the temperature Ti of the inside surface of the bulb is profoundly related to $((Wd)^{1/2}/R)$ which is fixed by the input power W supplied to the lamp, the thickness d of the bulb and the radius R of the bulb.

A lamp, in which Ar gas or Kr gas is added, due to this rare gas, has a greater thermal conductivity than a lamp in which Xe gas is added. Heat transfer between the temperature in the arc center and the temperature in the vicinity of the inside surface of the bulb, therefore, takes place easily. Furthermore, the ratio of energy use to the increase of the bulb temperature is high when the same energy is supplied to the lamp. Therefore, it was considered that, in this lamp, the thermal influence within the bulb must be adequately considered. It was found to be a good idea to fix the variable $((Wd)^{1/2}/R)$ within a stipulated range in order to eliminate the disadvantages of the beginning of condensation of mercury at an overly low temperature of the inside surface of the bulb and the devitrification of the bulb at an overly high temperature of the inside surface of the bulb.

In the following, the invention is further described using several embodiments shown in the drawings.

BRIEF DESCRIPTION OF THE DRAWINGS

FIG. 3 is a table of test results reflecting the action of the invention;

FIG. 4 is a table of additional test results reflecting the action of the invention;

FIG. 5 is another table of test results reflecting the action of the invention;

FIG. 6 is a table of still further test results reflecting the action of the invention; and FIG. 7 is still another table of test results reflecting the action of the invention;

DETAILED DESCRIPTION OF THE INVENTION

Figure 1:
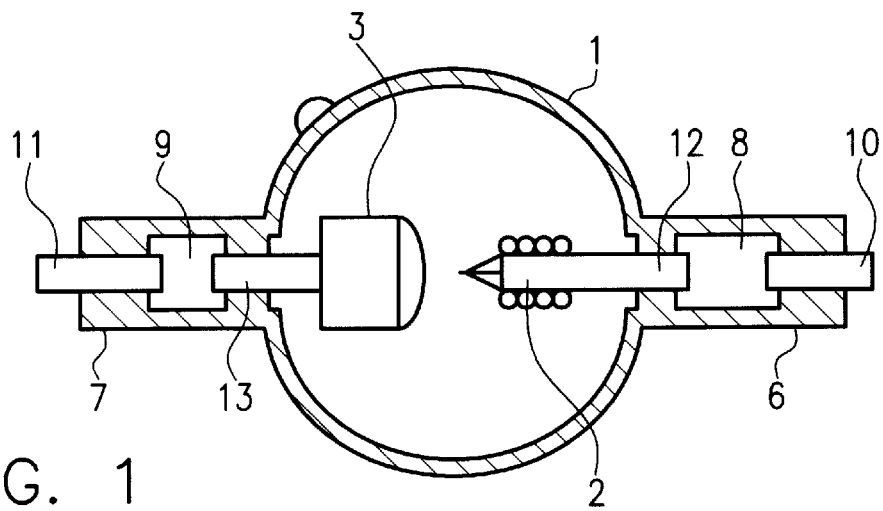
FIG. 1 is a schematic cross-sectional view of a mercury lamp of the short arc type in accordance with the invention.

FIG. 1 is a schematic of a mercury lamp of the short arc type in accordance with the present invention having an arc tube 1 of quartz in which a cathode 2 and an anode 3 are located opposite one another. The electrodes are each connected via inner leads 12 and 13 to metal foils 8 and 9 in hermetically sealed portions 6 and 7. Outer leads 10 and 11 are each connected to the metal foils 8 and 9.

Figure 2:
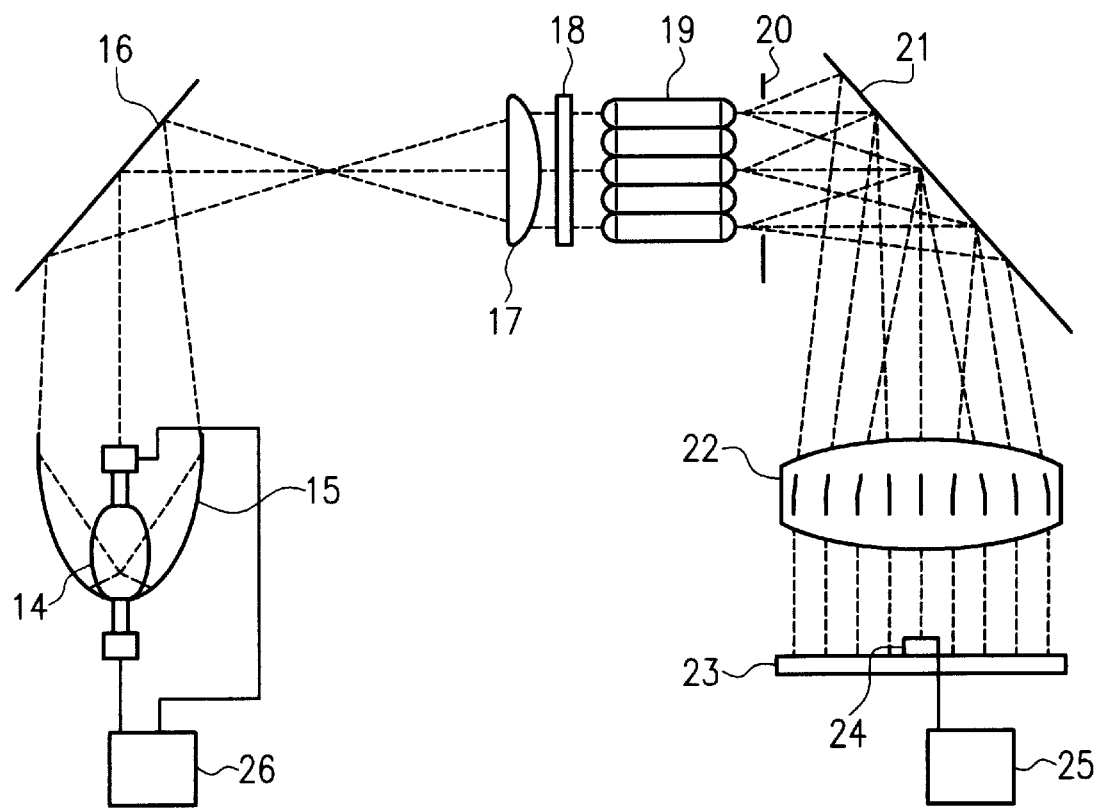
FIG. 2 shows a schematic of a UV emission device according to the invention.

FIG. 2 schematically shows a UV emission device in which light emerging from the lamp 14 passes through a spheroidal mirror 15 and a flat reflector 16, reaches a collimator 17 and a bandpass filter 18 with a main wavelength of 365 nm and a bandwidth of 10 nm, passes through an integrator lens 19, is reflected by a flat reflector 21, passes through a condenser lens 22 and reaches a reticle surface 23. On the reticle surface 23, there is a silicon photodiode detector 24. A power source 26 is connected to the lamp 14 and the desired power is supplied.

In the following, one experimental example is described in which the illuminance of the i-line of a mercury lamp in which argon or krypton or a mixture thereof is added was compared to a mercury lamp filled with xenon. Mercury lamps with the same conditions besides the amount of argon, krypton and xenon added were used. The illuminance of the i-line was measured using the detector 24 as shown in FIG. 2. Specifically, the mercury lamps have the following specification:

In a roughly spherical arc tube of quartz with an outside diameter of roughly 55 mm, there are an anode 3 of tungsten with a diameter of 20 mm and a cathode 2 of tungsten which contains 2% by weight thorium oxide with an effective diameter of the tip of 1.0 mm, located opposite one another. Mercury is added in an amount of 4.5 mg/cc lamp inside volume.

A lamp (lamp A) in which 2 atm xenon were added at room temperature, five different lamps (lamps B1 to F1) in which Ar was added in addition to the Xe, and five different lamps (lamps B2 to F2) in which Kr was added in addition to the Xe, were used. Five types of lamps in which Ar was added and of lamps in which Kr was added were produced at 0.3 atm, 1 atm, 3 atm, 8 atm and 12 atm and by changing the amount added. These lamps were operated by a constant current source 26 with an input power of roughly 2100 W and in a lamp position in which the cathode is pointed upward.

FIG. 3 shows the test results. Here, the irradiance of the i-line of lamp A is assumed and the relative irradiance of the i-line of the respective lamp is shown.

It is assumed that the measurement errors of irradiance are 1 to 2%. Conventionally, it is believed that even with consideration of these measurement errors, the throughput in the exposure process in the manufacture of semiconductors is clearly improved at an increase of at least 4%. The figure shows that, both for argon and also krypton, the relative irradiance is increased by greater than or equal to 4% when the gases are added in an amount at least equal to 1 atm.

In the lamps (lamps F1 and F2) in which 12 atm of argon or krypton were added at room temperature, the irradiance increased by 20%. However, the spectral width of the i-line broadened; this causes a reduction of the image resolution during exposure. As a result, it was found that in a mercury lamp filled with argon or krypton, by adding the argon or krypton in an amount of 1.0 atm to 8.0 atm, the irradiance can be effectively increased without the spectral width of the i-line broadening.

In the above described tests, lamps were devised in which argon (Ar) or krypton (Kr) together with xenon (Xe) was added. However, it was confirmed that the same effect can be obtained when argon (Ar) or krypton (Kr) is added as an element without adding xenon (Xe).

If, in lamps filled with Ar and Xe as the rare gas, the filling pressure of the xenon is roughly tripled as compared to the filling pressure of the argon, the irradiance of the i-line on the reticle surface rose according to the increase. It was, however, found that the irradiance of the i-line hardly increases when the pressure at which xenon is added is increased even more. Therefore, it is preferred that in the lamps in which Ar and Xe are added as the rare gas, the pressure at which the Xe is added is roughly tripled as compared to the pressure at which the Ar is added in order to increase the irradiance of the i-line on the reticle surface.

Furthermore, it was confirmed that it is preferred that the pressure at which the xenon is added be roughly triple that of the Kr pressure when Kr instead of Ar is added, and thus, a mixture of Kr and Xe is used.

(Embodiment 2)

Next, a test was run for lamps in which both Ar and Kr are added as the gas mixture. Apart from the amount of the gas mixture added, the respective lamp has the same form specification as in embodiment 1. Five lamps (G through N) were produced.

FIG. 4 shows the gas added to the respective lamp (A, G to N) and the pressure at which it was added. Lamp A is the same lamp A as in embodiment 1. Lamp A is filled with 2.0 atm of Xe. Lamps G through L contain no xenon, but contain Ar and Kr, each in an amount of 0.3 atm, 0.5 atm, 1.5 atm. 4.0 atm and 5.0 atm. In lamps M and N, Xe is added in an amount of 0.3 atm and 3.0 atm respectively and additionally Ar and Kr in an amount of 0.5 atm each.

FIG. 4 shows the results. When the lamp H filled with 0.5 atm Ar and 0.5 atm Kr at room temperature is compared to lamp A in which only Xe is added in an amount of 2 atm, it is apparent that the UV irradiance of the i-line on the reticle surface in lamp H compared to that in lamp A has increased by roughly 5% when they were used in an exposure device.

But, in lamp L, in which the arc tube was filled at room temperature with a mixture of 5.0 atm Ar and 5.0 atm Kr with a filling pressure of 1.0 atm, the irradiance of the i-line increased by 18%. However, here, the spectral width of the i-line broadened and the image resolution decreased during exposure.

In the test in which lamps were used as heating apparatus, it was found that the relative irradiance of the i-line on the reticle surface is effectively increased when a gas mixture of Ar and Kr at room temperature with a total pressure of 1.0 atm to 8.0 atm is added.

Furthermore, it was found that also in lamps M and N, in which Xe was added in addition to the gas mixture of Ar and Kr, the irradiance of the i-line can be effectively increased when the total filling pressure of Ar and Kr at room temperature is 1.0 atm to 8.0 atm. Comparison of lamp M with lamp N shows that, when the filling pressure of Xe is increased, the irradiance of the i-line on the reticle surface also rises accordingly.

On the other hand, the inventors confirmed by their experiments that the irradiance of the i-line hardly increases when the filling pressure of Xe is more than roughly triple the total filling pressure of Ar and Kr. With respect to the increase of irradiance of the i-line it is, therefore, preferred that the filling pressure of Xe is increased only to roughly triple the total filling pressure of Ar and Kr.

With respect to the value $(Wd)^{1/2}/R$, the following will be described.

First, an experiment is described which shows the devitrification of the bulb and the beginning of condensation of the mercury in conjunction with half the value of the maximum diameter of the arc tube (bulb) R (cm), the thickness d (cm) of the bulb and the input power W (kW) supplied to the lamp in a mercury lamp in which argon is added.

Here, the expression "maximum bulb diameter" is defined as the direction of the cross section which is perpendicular to the longitudinal axis direction, i.e. the direction between the anode and the cathode. In the experiment, five different mercury lamps were prepared in which 3 atm of argon at room temperature were added, the above described parameters were each changed and the respective lamp was studied using the value of $(Wd)^{1/2}/R$.

Specifically the mercury lamps have the following specifications.

In a roughly spherical arc tube of quartz, there are an anode of tungsten with a diameter of 20 mm and a cathode of tungsten which contains 2% by weight thorium oxide located opposite one another. Mercury is added in an amount of 4.5 mg/cc lamp inside volume.

FIG. 5 shows the results. In lamp X1, 20 hours after the start of operation, on the inside of the bulb, devitrification had progressed rapidly and radiation had dropped quickly.

This is presumably because the temperature of the lamp interior was too high, and therefore, devitrification had progressed. In lamp X5, the lamp voltage fluctuated immediately after the start of operation and radiation was not stabilized. Furthermore, when the lamp was observed during operation, the beginning of condensation of the mercury on the inside of the bulb was confirmed.

In the following, a corresponding experiment for a mercury lamp is described in which krypton was added.

In the experiment, five different mercury lamps were prepared in which 3 atm of krypton were added at room temperature, and the above described parameters were each changed and the respective lamp was studied using the value of $(Wd)^{1/2}/R$. The concrete specification of the mercury lamps is identical to the case of adding argon described above.

In lamp Y1, it was confirmed that 20 hours after the start of operation on the inside of the bulb devitrification had progressed rapidly and radiation had dropped quickly. This is presumably because the temperature of the inside of the bulb was too high, and therefore, devitrification progressed. In lamp Y5, the lamp voltage fluctuated immediately after the start of operation and radiation was not stabilized. When the lamp was observed during operation, the beginning of condensation of the mercury on the inside of the bulb was confirmed.

In the following, a corresponding experiment for a mercury lamp is described in which argon and krypton were added.

In the experiment, five different mercury lamps were prepared in which 1.5 atm of argon, 1.5 atm krypton and 0.5 atm xenon were added at room temperature, the above described parameters were each changed and the respective lamp was studied using the value of $(Wd)^{1/2}/R^2$. The concrete specification of the mercury lamps is identical to the above described case of adding argon and krypton.

In lamp Z1, it was confirmed that 20 hours after the start of operation on the inside of the bulb devitrification had progressed rapidly and radiation had dropped quickly. This is presumably because the temperature of the inside of the bulb was too high, and therefore, devitrification has progressed. In lamp Z5, the lamp voltage fluctuated immediately after the start of operation and radiation was not stabilized. When the lamp was observed during operation, the beginning of condensation of the mercury on the inside of the bulb was confirmed.

Furthermore, in the above described mercury lamps of the short arc type, fluctuations of the cathode spot can be suppressed by operation in a lamp position in which the anode is pointed upwards.

In the UV emission device in accordance with the invention, the optical system shown in FIG. 2 is used. This enables irradiation with a high focusing efficiency.

Action of the Invention

As was described above, in a mercury lamp of the short arc type in which argon (Ar) and/or krypton (Kr) is added as the rare gas, a pressure of 1.0 to 8 atm at which this rare gas is added can increase the radiant efficiency and the radiance without increasing the input power.

Furthermore, in a mercury lamp in which argon (ar) and/or krypton (kr) is added in a stipulated amount, devitrification of the bulb and the beginning of condensation of the mercury can be advantageously prevented by fixing the value of $(Wd)^{1/2}/R$ at a stipulated value, $(Wd)^{1/2}/R$ being fixed by half the value of the maximum diameter of the bulb r (cm), the thickness d (cm) of the bulb and the input power W(kW) supplied to the lamp.

What we claim is:

1. Mercury lamp of the short arc type comprising a quartz arc tube in which a cathode and an anode are disposed opposite one another and which is filled with mercury and a rare gas; wherein the rare gas comprises at least argon (Ar) with a pressure from 1.0 to 8 atm at room temperature; and wherein the relationship $0.211 \leq ((Wd)^{1/2}/R) \leq 0.387$ is satisfied, where R is half of a maximum diameter of the arc tube in a radial direction which is perpendicular to a direction between the anode and the cathode in cm, d is a thickness of the bulb in cm, and W is input power in kW.

2. Mercury lamp of the short arc type as claimed in claim 1, wherein the rare gas further comprises xenon (Xe) which is added with a pressure at room temperature which is at most triple the argon pressure.

3. Mercury lamp of the short arc type comprising a quartz arc tube in which a cathode and an anode are disposed opposite one another and which is filled with mercury and a rare gas; wherein the rare gas comprises at least krypton (Kr) with a pressure from 1.0 to 8 atm at room temperature; and wherein the relationship $0.205 \leq ((Wd)^{1/2}/R) \leq 0.418$ is satisfied, where R is half of a maximum diameter of the arc tube in a radial direction which is perpendicular to a direction between the anode and the cathode in cm, d is a thickness of the bulb in cm, and W is input power in kW.

4. Mercury lamp of the short arc type as claimed in claim 3, wherein the rare gas further comprises xenon (Xe) which is added with a pressure at room temperature which is at most triple the krypton pressure.

5. Mercury lamp of the short arc type comprising a quartz arc tube in which a cathode and an anode are disposed opposite one another and which is filled with mercury and a rare gas; wherein the rare gas comprises at least krypton and argon with a total pressure from 1.0 to 8 atm at room temperature as the rare gas; and wherein the relationship $0.209 \leq ((Wd)^{1/2}/R) \leq 0.387$ is satisfied, where R is half of a maximum diameter of the arc tube in a radial direction which is perpendicular to a direction between the anode and the cathode in cm, d is a thickness of the bulb in cm, and W is input power in kW.

6. Mercury lamp of the short arc type as claimed in claim 5, wherein the rare gas further comprises xenon with a pressure at room temperature which is at most triple the total pressure of the argon and krypton.

7. UV emission device comprising:
 a mercury lamp comprising a quartz arc tube in which a cathode and an anode are disposed opposite one another and which is filled with mercury and a rare gas; wherein the rare gas comprises at least argon (Ar) with a pressure from 1.0 to 8 atm at room temperature; and wherein the relationship $0.211 \leq ((Wd)^{1/2}/R) \leq 0.387$ is satisfied, where R is half of a maximum diameter of the arc tube in a radial direction which is perpendicular to a direction between the anode and the cathode in cm, d is a thickness of the bulb in cm, and W is input power in kW, and
 a power source which supplies a fixed value of said input power W to the mercury lamp.

8. UV emission device according to claim 7, wherein the rare gas in the arc tube of the lamp further comprises xenon (Xe) which is added with a pressure at room temperature which is at most triple the argon pressure.

9. UV emission device
 comprising a quartz arc tube in which a cathode and an anode are disposed opposite one another and which is filled with mercury and a rare gas; wherein the rare gas comprises at least krypton (Kr) with a pressure from 1.0 to 8 atm at room temperature; and wherein the relationship $0.205 \leq ((Wd)^{1/2}/R) \leq 0.418$ is satisfied, where R is half of a maximum diameter of the arc tube in a radial direction which is perpendicular to a direction between the anode and the cathode in cm, d is a thickness of the bulb in cm, and W is input power in kW; and
 a power source which supplies a stipulated power to this mercury lamp.

10. UV emission device according to claim 9, wherein the rare gas in the arc tube of the lamp further comprises xenon (Xe) which is added with a pressure at room temperature which is at most triple the krypton pressure.

11. UV emission device which comprises:
 a mercury lamp comprising a quartz arc tube in which a cathode and an anode are disposed opposite one another and which is filled with mercury and a rare gas; wherein the rare gas comprises at least krypton and argon with a total pressure from 1.0 to 8 atm at room temperature as the rare gas; and wherein the relationship $0.209 \leq ((Wd)^{1/2}/R) \leq 0.387$ is satisfied, where R is half of a maximum diameter of the arc tube in a radial direction which is perpendicular to a direction between the anode and the cathode in cm, d is a thickness of the bulb in cm, and W is input power in kW; and
 a power source which supplies a stipulated power to this mercury lamp.

12. UV emission device according to claim 11, wherein the rare gas in the arc tube of the lamp further comprises xenon (Xe) which is added with a pressure at room temperature which is at most triple the total pressure of krypton and argon.

13. UV emission device as claimed in claim 7, wherein the mercury lamp is arranged vertically such that the anode is at the top and the cathode is at the bottom.

14. UV emission device as claimed in claim 8, wherein the mercury lamp is arranged vertically such that the anode is at the top and the cathode is at the bottom.

15. UV emission device as claimed in claim 9, wherein the mercury lamp is arranged vertically such that the anode is at the top and the cathode is at the bottom.

16. UV emission device as claimed in claim 10, wherein the mercury lamp is arranged vertically such that the anode is at the top and the cathode is at the bottom.

17. UV emission device as claimed in claim 11, wherein the mercury lamp is arranged vertically such that the anode is at the top and the cathode is at the bottom.

18. UV emission device as claimed in claim 12, wherein the mercury lamp is arranged vertically such that the anode is at the top and the cathode is at the bottom.

* * * * *